US012700854B2

(12) United States Patent
Poullet et al.

(10) Patent No.: US 12,700,854 B2
(45) Date of Patent: Aug. 4, 2026

(54) CLOCK GENERATOR AND METHOD OF CLOCK GENERATION

(71) Applicant: DOLPHIN SEMICONDUCTOR, Paris (FR)

(72) Inventors: Frédéric Poullet, Paris (FR); Ayoub Boundouq, Paris (FR)

(73) Assignee: DOLPHIN SEMICONDUCTOR, Paris (FR)

( * ) Notice: Subject to any disclaimer, the term of this patent is extended or adjusted under 35 U.S.C. 154(b) by 0 days.

(21) Appl. No.: 18/802,646

(22) Filed: Aug. 13, 2024

(65) Prior Publication Data

US 2025/0062751 A1　　Feb. 20, 2025

(51) Int. Cl.
*H03K 3/03* (2006.01)
*H03K 5/133* (2014.01)
*H03K 19/173* (2006.01)

(52) U.S. Cl.
CPC ........... *H03K 3/0315* (2013.01); *H03K 5/133* (2013.01); *H03K 19/1737* (2013.01)

(58) Field of Classification Search
CPC .................................................. H03K 3/0315
USPC .......................................................... 331/57
See application file for complete search history.

(56) References Cited

U.S. PATENT DOCUMENTS 5,355,097 A　　10/1994　Scott et al.
8,791,737 B2 *　7/2014　Cheng ................... H03L 7/0995
　　　　　　　　　　　　　　　　　　327/157

10,797,712 B1　10/2020　Owczarczyk et al.
2005/0046489 A1　3/2005　Cranford, Jr. et al.
2013/0222067 A1　8/2013　Yin et al.
2016/0094231 A1　3/2016　Li et al.

OTHER PUBLICATIONS

Search Report for French Application No. 23/08754 mailed Mar. 14, 2024.
IEEE Computer Society; "IEEE Standard for Design and Verification of Low-Power, Energy-Aware Electronic Systems" IEEE Std 1801™-2018 (Revision of IEEE Std 1801-2015) Sep. 27, 2018.

* cited by examiner

*Primary Examiner* — Joseph Chang

(74) *Attorney, Agent, or Firm* — Perilla Knox & Hildebrandt LLP; Jason M. Perilla

(57) ABSTRACT

The present disclosure relates to a clock generator comprising: a ring oscillator configured to generate an output frequency signal; a frequency detector configured to compare a frequency of the output frequency signal with r times a frequency of a reference frequency signal and to generate a feedback signal; and a control circuit configured to: control a loop delay parameter of the ring oscillator and a supply voltage of the ring oscillator based on the feedback signal; reduce the frequency of the output frequency signal when its frequency is higher than r times the frequency of the reference frequency signal by reducing the supply voltage; and increase the frequency of the output frequency signal when its frequency is lower than r times the frequency of the reference frequency signal by reducing the loop delay parameter.

14 Claims, 7 Drawing Sheets

CLOCK GENERATOR AND METHOD OF CLOCK GENERATION

CROSS-REFERENCE TO RELATED APPLICATIONS

This application claims priority to French patent application number FR 23/08754, filed on Aug. 17, 2023, entitled "CLOCK GENERATOR AND METHOD OF CLOCK GENERATION," the entire contents of which is hereby incorporated herein by reference.

TECHNICAL FIELD

The present disclosure relates generally to electronic circuits, and in particular to clock generator and method of clock generation.

BACKGROUND ART

There is an increasing demand for low power solutions for electronic circuits, particularly for battery powered devices, such as IoT (Internet of Things) devices, for which it is desired to increase the battery life between charges.

Low-power clock generators can be part of the solution for reducing power consumption of electronic circuits. For example, one part of an integrated circuit that is particularly power consuming is the system clock, which is generally at a relatively high frequency. One mechanism for reducing the power consumption of an integrated circuit is to make use of low-power or sleep modes when the circuit is inactive, and to switch off the system clock during such periods. A low-power local clock generator can then be used for driving the wakeup circuit that will wakeup the integrated circuit at the appropriate time, without the use of a central processing unit (CPU).

Such a clock generator should be capable of generating a clock signal at a frequency that is relatively stable as a function of PVT (Process, Voltage, Temperature) variations, and which in some cases is a variable frequency. This involves the use of a control loop for regulating the clock frequency. However, there are technical difficulties in implementing such a control loop that is capable of converging rapidly to the frequency and voltage state in which electrical consumption is relatively low.

SUMMARY OF INVENTION

It is an aim of embodiments of the present disclosure to at least partially address one or more needs in the prior art.

According to one aspect, there is provided A clock generator comprising: a ring oscillator configured to generate an output frequency signal; a frequency detector configured to compare a frequency of the output frequency signal with r times a frequency of a reference frequency signal and to generate a feedback signal based on the comparison; and a control circuit configured to control a loop delay parameter of the ring oscillator and a supply voltage of the ring oscillator based on the feedback signal, wherein the control circuit is configured: to reduce the frequency of the output frequency signal when its frequency is higher than r times the frequency of the reference frequency signal by reducing the supply voltage, unless the supply voltage has reached a minimal level, in which case the loop delay parameter is then increased; and to increase the frequency of the output frequency signal when its frequency is lower than r times the frequency of the reference frequency signal by reducing the loop delay parameter, unless the loop delay parameter has reached a minimal level, in which case the supply voltage is then increased.

According to one embodiment, the control circuit is configured to prevent modifications of the supply voltage once the control circuit has detected that the loop delay parameter has reached its minimal level.

According to one embodiment, the control circuit is configured to iteratively reduce and/or increase the loop delay parameter, the reduction or increase upon each iteration being equal to a step size.

According to one embodiment, the step size is variable as a function of a frequency difference between the frequency of the output frequency signal and the frequency of the reference frequency signal.

According to one embodiment, the step size is equal to a first size until the loop delay parameter reaches the minimal level, and to a second size, lower than the first size, after the loop delay parameter has reached the minimal level.

According to one embodiment, the clock generator further comprises a sigma-delta converter configured to convert the loop delay parameter into a plurality of control signals configured to control the ring oscillator.

According to one embodiment, the frequency detector is configured to compare the frequency of the output frequency signal with r times the frequency of the reference frequency signal by comparing the output frequency signal with r times the frequency of the reference frequency signal.

According to one embodiment, the ring oscillator comprises a plurality of delay stages, each delay stage comprising: a multiplexer; a delay element coupled to a first input of the multiplexer, the first input being selected by a first state of a control signal of the multiplexer; a bypass path coupled to a second input of the multiplexer, the second input being selected by a second state of the control signal of the multiplexer; and a logic gate coupling the output of a previous stage to an input of the delay element, the logic gate receiving the control signal of the multiplexer and being configured to supply a constant signal to the delay element while the control signal is in the second state.

According to one embodiment, r is a real number greater than 1.

According to a further aspect, there is provided an integrated circuit comprising: an electronic circuit controlled by a clock signal; and the above clock generator configured to supply the clock signal to the electronic circuit.

According to one embodiment, the integrated circuit further comprises: a voltage regulator configured to generate said supply voltage; and a further electronic circuit powered by said supply voltage.

According to yet a further aspect, there is provided a method of clock generation comprising: generating, by a ring oscillator, an output frequency signal; comparing, by a frequency detector, a frequency of the output frequency signal with r times a frequency of a reference frequency signal in order to generate a feedback signal based on the comparison; and controlling, by a control circuit based on the feedback signal, a loop delay parameter of the ring oscillator and a supply voltage of the ring oscillator, by: reducing the frequency of the output frequency signal when its frequency is higher than r times the frequency of the reference frequency signal by reducing the supply voltage, unless the supply voltage has reached a minimal level, in which case the loop delay parameter is then increased; and increasing the frequency of the output frequency signal when its frequency is lower than r times the frequency of the reference frequency signal by reducing the loop delay parameter, unless the loop delay parameter has reached a minimal level, in which case the supply voltage is then increased.

BRIEF DESCRIPTION OF DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
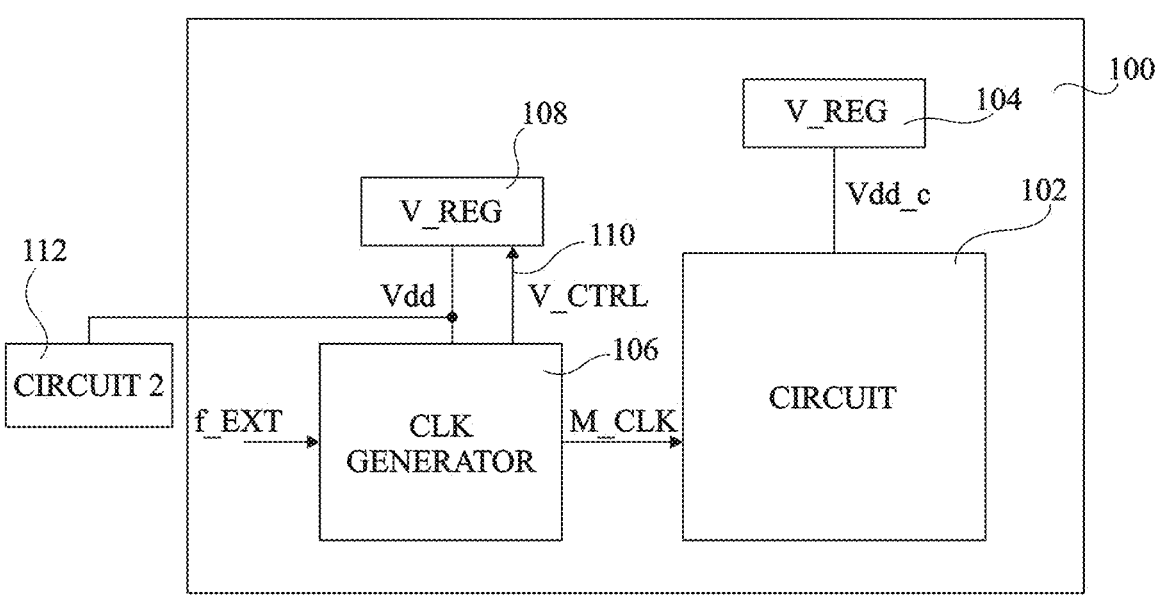
FIG. 1 schematically illustrates an integrated circuit comprising a clock generator according to an example embodiment of the present disclosure.

FIG. 1 schematically illustrates an integrated circuit 100 comprising a circuit (CIRCUIT) 102 powered by a supply voltage Vdd_c generated by a voltage regulator (V_REG) 104, and controlled by a clock signal M_CLK generated by a clock generator (CLK GENERATOR) 106. In some embodiments, the circuit 100 is configured to implement a wakeup function for waking up the integrated circuit 100 at an appropriate time. Alternatively, the circuit 100 has other functions that can be implemented under control of the clock signal M_CLK.

The clock generator 106 for example receives an input frequency signal f_EXT and a supply voltage Vdd.

The input frequency signal f_EXT is for example an external signal generated by an off-chip circuit, such as a PLL (Phase Locked Loop). The input frequency signal f_EXT for example has a frequency that is relatively stable as a function of PVT (Process, Voltage, Temperature) variations.

The supply voltage Vdd is for example generated by a further voltage regulator (V_REG) 108. In some embodiments, the clock generator 106 is configured to control the supply voltage Vdd provided by the voltage regulator 108, for example by transmitting a control signal V_CTRL to the voltage regulator 108 on a control line 110. In some embodiments, the voltage regulator 108 is also configured to supply a further circuit (CIRCUIT2) 112 with the supply voltage Vdd, the further circuit 112 for example being external to the integrated circuit 100.

Figure 2:
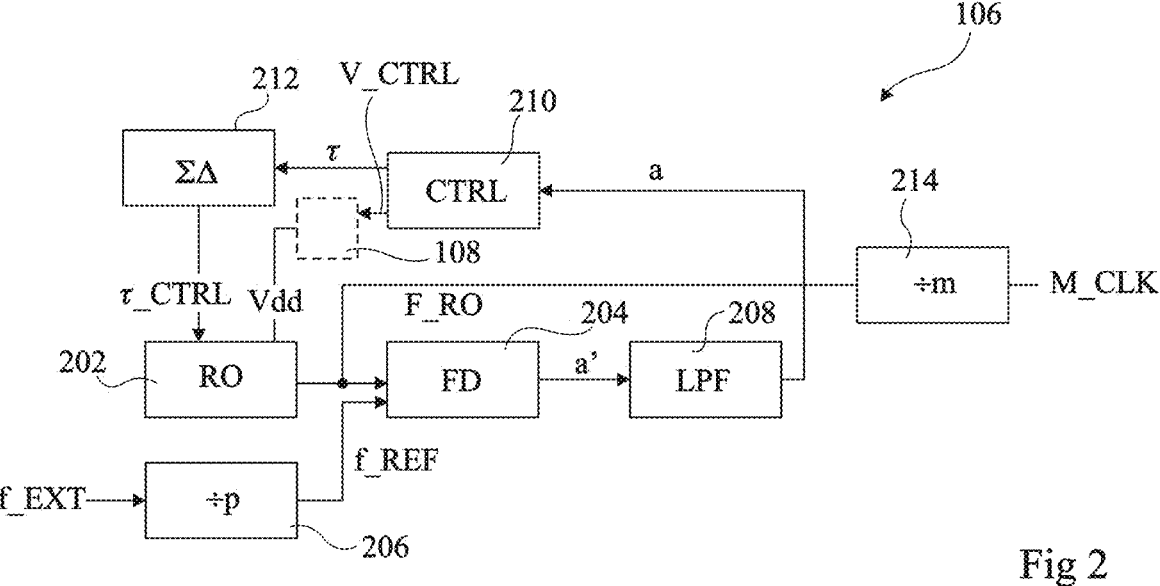
FIG. 2 schematically illustrates the clock generator of FIG. 1 in more detail according to an example embodiment of the present disclosure.

FIG. 2 schematically illustrates the clock generator 106 of FIG. 1 in more detail according to an example embodiment of the present disclosure.

The clock generator 106 for example comprises a ring oscillator (RO) 202 configured to generate an output frequency signal F_RO.

The clock generator 106 also for example comprises a frequency detector (FD) 204, configured to receive the output frequency signal F_RO from the ring oscillator 202, and to compare the frequency of the signal F_RO with the frequency of a reference frequency signal f_REF. For example, the reference frequency signal f_REF is generated by a frequency divider (÷p) 206, based on the input frequency signal f_EXT. For example, the frequency divider 206 is configured to divide the frequency of the input frequency signal f_EXT by a division coefficient p in order to generate the reference frequency signal f_REF, where p is for example equal to one or more.

The frequency detector 204 is for example configured to generate an output signal a' equal to freq_RO/freq_REF-r, where freq_RO is the frequency of the signal F_RO, freq_REF is the frequency of the signal f_REF, and r is a desired ratio between the frequencies of the signals F_RO and f_REF. In some embodiments, r is a real number equal to or greater than 1. The output signal a' is for example a digital signal. The output signal a' is for example processed by a low-pass filter (LPF) 208 in order to generate a feedback signal a, which is provided to a control circuit (CTRL) 210. The control circuit (CTRL) 210 is configured to apply a control algorithm based on the feedback signal a, in order to adjust the supply voltage Vdd and/or the loop delay parameter $\tau$ of the ring oscillator 202. For example, the control circuit 210 outputs the control signal V_CTRL to the voltage regulator 108, which in turn generates the corresponding supply voltage Vdd, which is supplied to the ring oscillator 202. The control circuit 210 also for example outputs the control signal τ indicating the delay to be applied by the ring oscillator 202. In some embodiments, the control signal τ is provided to a sigma-delta converter 212, which is configured to generate, based on the control signal T, a further control signal τ_CTRL, which is used to control the ring oscillator. For example, the control signal τ is an n-bit signal, and the control signal τ_CTRL is an n'-bit signal, where n'<n. In one embodiment, the control signal τ is an 8-bit signal, and the control signal τ_CTRL is a 4-bit signal.

The output frequency signal F_RO is for example supplied to a frequency divider (÷m) 214, which is configured to divide the frequency of the signal F_RO by a division coefficient m in order to generate the output clock signal M_CLK, where m is for example equal to one or more.

In alternative embodiments of the clock generator 106, the frequency divider 206 and/or the frequency divider 214 could be omitted.

Figure 3:
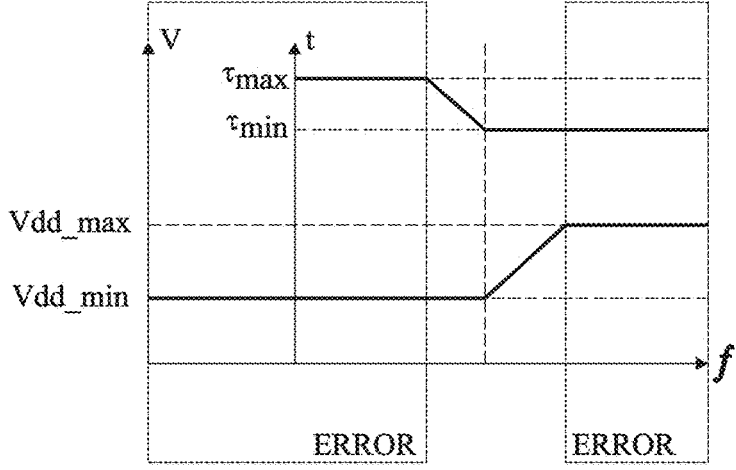
FIG. 3 is a graph illustrating an example of valid ranges of a supply voltage and of a delay parameter of a ring oscillator of the clock generator of FIG. 2 according to an example embodiment of the present disclosure.

FIG. 3 is a graph illustrating an example of valid ranges of the supply voltage Vdd and of the delay τ of the ring oscillator 202 of the clock generator 106 of FIG. 2 according to an example embodiment of the present disclosure.

As illustrated, the supply voltage Vdd for example has a maximum level Vdd_max and a minimum level Vdd_min, such that: Vdd_min<Vdd<Vdd_max.

Similarly, the ring oscillator delay τ has a maximum level $\tau_{max}$ and a minimum level $\tau_{min}$, such that: $\tau_{min}<\tau<\tau_{max}$.

An error is for example generated when the supply voltage is at Vdd_max while the ring oscillator delay is at $\tau_{min}$, or when the supply voltage is at Vdd_min while the ring oscillator delay is at $\tau_{max}$, because the system is unable to generate the expected frequency.

Referring again to FIG. 2, the control circuit 210 is configured to control the loop delay parameter τ of the ring oscillator 202 and the supply voltage Vdd of the ring oscillator 202 based on the feedback signal a. In particular, the control circuit 210 is configured to reduce the frequency of the output frequency signal F_RO when its frequency is higher than r times the frequency of the reference frequency signal f_REF by reducing the supply voltage, unless the supply voltage has reached the minimal level Vdd_min, in which case the loop delay parameter τ is then increased. The control circuit 210 is also configured to increase the frequency of the output frequency signal F_RO when its frequency is lower than r times the frequency of the reference frequency signal f_REF by reducing the loop delay parameter τ, unless the loop delay parameter τ has reached the minimal level $\tau_{min}$, in which case the supply voltage Vdd is then increased.

Figure 4:
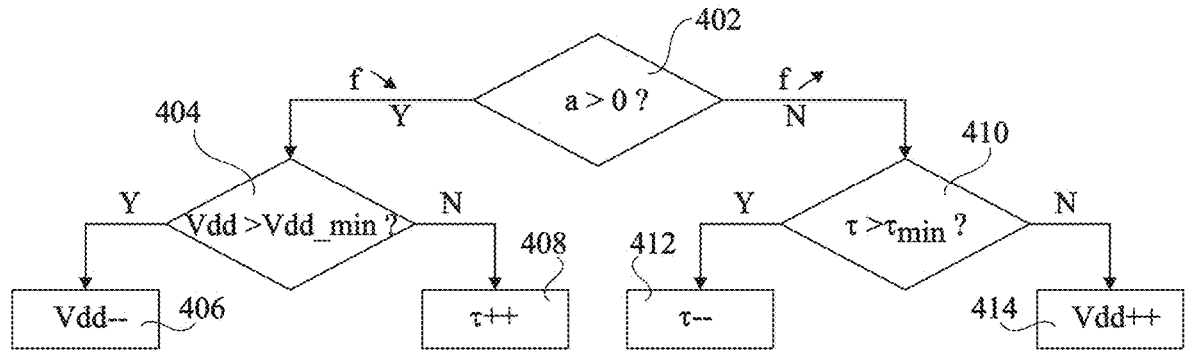
FIG. 4 is a flow diagram illustrating operations in a method of clock generation according to an example embodiment of the present disclosure.

FIG. 4 is a flow diagram illustrating the operations implemented by the control circuit 210 of FIG. 2 in more detail according to an example embodiment of the present disclosure.

In an operation 402, it is determined whether the feedback signal a is greater than 0. Indeed, in some embodiments, a positive value of the signal a indicates that the frequency of the signal F_RO is higher than r times the frequency of the reference signal f_REF, whereas a negative value of the signal a indicates that the frequency of the signal F_RO is lower than r times the frequency of the reference signal f_REF. In alternative embodiments, the feedback signal a could have other values to indicate the relative frequencies of the signals F_RO and f_REF.

In the case that the feedback signal a is positive (branch Y), the frequency of F_RO is for example reduced. This for example involves an operation 404, in which it is determined whether the supply voltage Vdd is greater than Vdd_min. If so (branch Y), the supply voltage Vdd is for example reduced in an operation 406. If not (branch N), the ring oscillator delay τ is for example increased in an operation 408.

In the case that the feedback signal a is negative (branch N), the frequency of F_RO is for example increased. This for example involves an operation 410, in which it is determined whether the ring oscillator delay τ is greater than the minimum level $\tau_{min}$. If so (branch Y), the ring oscillator delay τ is for example reduced in an operation 412. If not (branch N), the supply voltage Vdd is for example increased in an operation 414.

After operation 406, 408, 412 or 414, the method is for example repeated for the new value of the target signal F_RO based on the updated supply voltage Vdd or the updated ring oscillator delay τ.

An advantage with favoring a reduction in the supply voltage for decreasing the frequency and a reduction in the ring oscillator delay τ for increasing the frequency is that this algorithm converges towards a relatively low supply voltage Vdd, and thus a state in which electrical consumption is relatively low.

Figures 5, 7:
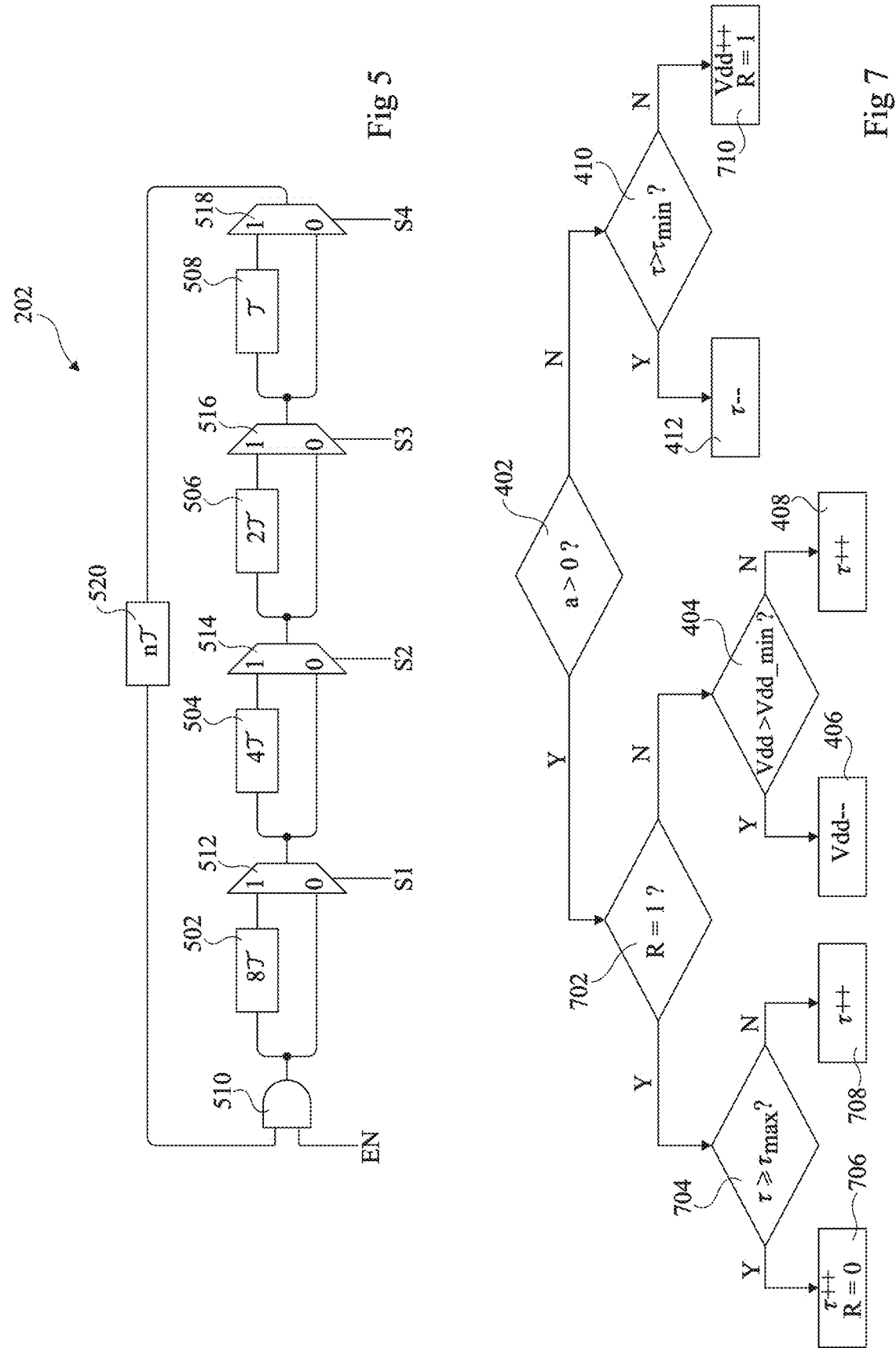
FIG. 5 schematically illustrates a ring oscillator according to an example embodiment of the present disclosure.
FIG. 7 is a flow diagram illustrating operations in a method of clock generation according to a further example embodiment of the present disclosure.

FIG. 5 schematically illustrates the ring oscillator 202 of FIG. 2 in more detail according to an example embodiment of the present disclosure.

In the example of FIG. 5, the ring oscillator comprises a series of delay elements 502, 504, 506 and 508. In some embodiments, the delay elements have a binary weighting, the element 502 for example introducing a delay of 8*T, the element 504 for example introducing a delay of 4*T, the element 506 for example introducing a delay of 2*T, and the element 508 for example introducing a delay of T, where T is a unit delay, equal for example to between 1 and 100 ns.

The delay element 502 is for example coupled between the output of a logic gate 510, which is for example an AND gate, and one input of a multiplexer 512. A second input of the multiplexer 512 is for example connected directly to the output of the logic gate 510.

The delay element 504 is for example coupled between the output of the multiplexer 512, and one input of a multiplexer 514. A second input of the multiplexer 514 is for example connected directly to the output of the multiplexer 512.

The delay element 506 is for example coupled between the output of the multiplexer 514, and one input of a multiplexer 516. A second input of the multiplexer 516 is for example connected directly to the output of the multiplexer 514.

The delay element 508 is for example coupled between the output of the multiplexer 516, and one input of a multiplexer 518. A second input of the multiplexer 518 is for example connected directly to the output of the multiplexer 516.

The multiplexers 512, 514, 516 and 518 are for example controlled by control signals S1, S2, S3 and S4 respectively, these control signals for example forming the control signal τ_CTRL generated by the sigma-delta converter 212 of FIG. 2. In one example, a low, or zero, logic state of any of the control signals S1 to S4 causes the output signal of the logic gate 510 or of the preceding multiplexer 512, 514, 516 to be selected by the corresponding multiplexer 512, 514, 516, 518, whereas a high, or one, logic state of any of the control signals S1 to S4 causes the output of the corresponding delay element 502, 504, 506 or 508 to be selected by the corresponding multiplexer 512, 514, 516, 518.

The output of the multiplexer 518 is for example coupled to one input of the logic gate 510 via a further delay element 520, which is for example configured to introduce a delay of n*T, where n is for example equal to between 1 and 50. The other input of the logic gate 510 for example receives an enable signal EN, the ring oscillator 202 for example being operational when the enable signal EN is at a logic high level.

Thus, in the example of FIG. 5, the ring oscillator 202 can be controlled to have a loop delay of between n*T and n*T+15 T.

Figure 6:
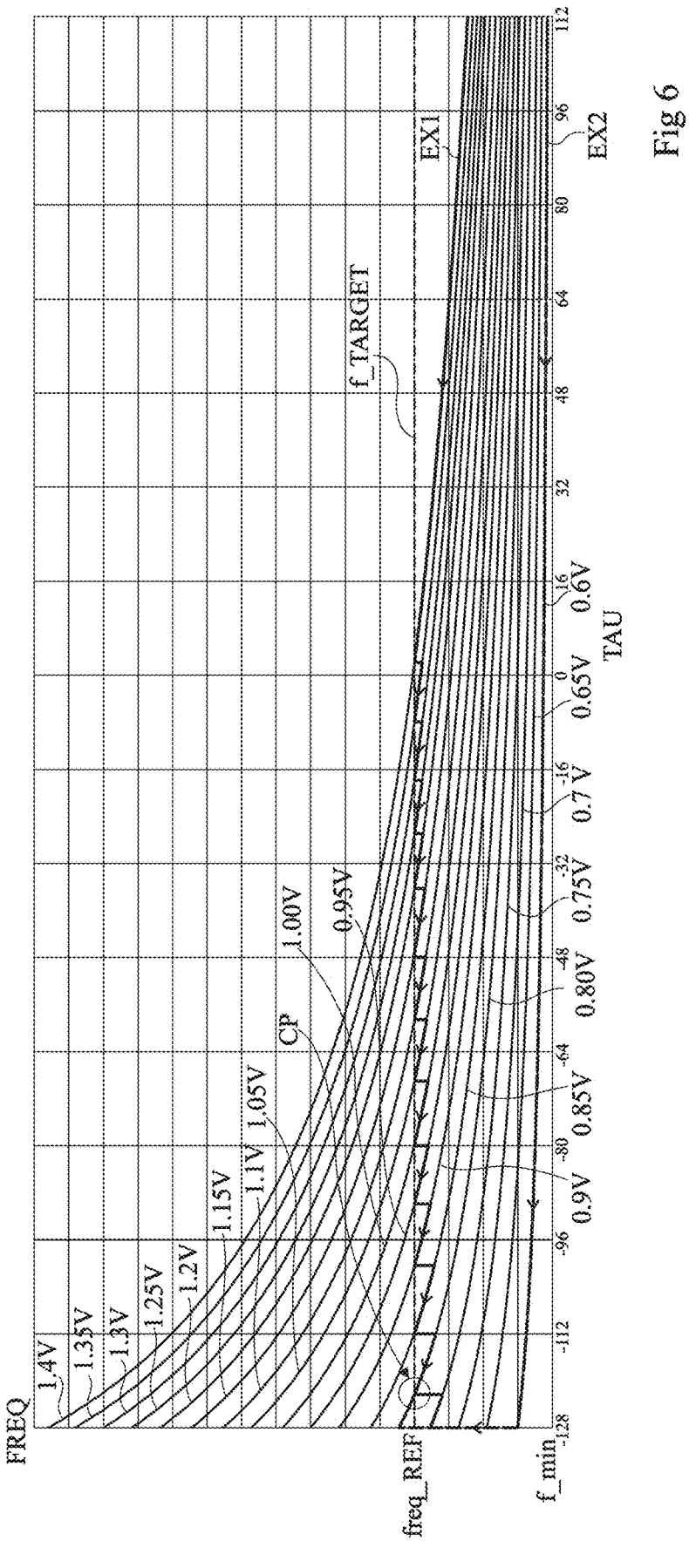
FIG. 6 is a graph representing frequency as a function of a loop delay parameter $\tau$ for a range of voltage settings.

FIG. 6 is a graph representing frequency (FREQ) as a function of the parameter $\tau$ (TAU) for a range of voltage settings, and illustrates examples of the control algorithm of FIG. 4.

In the example of FIG. 6, the parameter $\tau$ is in the range −128 to +127 (only up to +112 being illustrated in FIG. 6). Such a range of values is for example obtained using the ring oscillator of FIG. 5 and controlling the four control bits S1 to S4 to have a corresponding one of their 16 settings, and by using the sigma-delta converter 212 of FIG. 2 to provide a further four bits of control, leading to a total of 8 bits of control, or 256 values of the parameter $\tau$.

Furthermore, 17 curves in FIG. 6 represent the output frequency for supply voltages in the range 0.6 V to 1.4 V.

According to a first example EX1 of the control algorithm, the supply voltage starts at its highest level of 1.4V, and the parameter $\tau$ starts at its highest level allowed by the clock generator 106, for example equal to 112. The parameter $\tau$ is then reduced by the operations 402, 410 and 412 of FIG. 4, until the frequency of F_RO rises above a target frequency freq_TARGET equal to r times the frequency of the reference frequency signal f_REF. The supply voltage is then iteratively reduced by the operations 402, 404 and 406 of FIG. 4, each iteration causing the frequency of F_RO to fall below the target frequency freq_TARGET, and resulting in a further reduction in the parameter $\tau$, until the parameter $\tau$ reaches its minimal level $\tau_{min}$ of −128, at which point the supply voltage and parameter $\tau$ are each increased in order to arrive at a convergence point CP. The supply voltage and parameter $\tau$ then for example enter into a permanent hysteresis loop in which they oscillate between their values at the convergence point and the next lowest levels.

According to the example EX2 in FIG. 6, the supply voltage stages at is lowest value Vdd_min, resulting in a frequency of F_RO that is below the target frequency freq_TARGET equal to r times the frequency of the signal f_REF, and thus operations 402, 410 and 412 of FIG. 4 cause the parameter $\tau$ to be reduced until the parameter $\tau$ reaches its minimal level $\tau_{min}$ of −128. The supply voltage is then increased until the frequency of the signal F_RO exceeds the target frequency freq_TARGET, at which point the parameter $\tau$ is increased in order to arrive at a convergence point CP. The supply voltage and parameter $\tau$ then for example enter into a permanent hysteresis loop in which they oscillate between their values at the convergence point and the next lowest levels.

In order to prevent variations in the supply voltage during the hysteresis loop, which may lead to additional power consumption, a modified algorithm is for example used, as will now be described in more detail with reference to FIG. 7.

FIG. 7 is a flow diagram illustrating operations in a method of clock generation according to a further example embodiment of the present disclosure. This method is for example implemented by the control circuit 210 of FIG. 2.

Certain operations of FIG. 7 are the same as operations of FIG. 4, and these operations have been labelled with like reference numerals and will not be described again in detail.

The algorithm of FIG. 7 for example starts with the operation 402, and if the feedback signal a is less than 0 (branch N), the operation 410 is implemented, and if the parameter $\tau$ is greater than its minimal level $\tau_{min}$ (branch Y) then the operation 412 is performed as in FIG. 4. However, if the parameter $\tau$ is not greater than its minimal level $\tau_{min}$ (branch N), then in an operation 710, the supply voltage is increased, and a variable R is set equal to 1. The variable R is for example one bit of information which is initialized at zero at the start of the algorithm.

If in operation 402 the feedback signal a is less than 0 (branch Y), an operation 702 is performed, in which it is determined whether the variable R is equal to 1. If not (branch N), then operation 404, followed by operation 406 or 408, are performed, like in FIG. 4. However, if R is equal to 1 (branch Y), then in an operation 704, it is determined whether the parameter $\tau$ is greater than or equal to its maximum level $\tau_{max}$, which is for example a threshold value used to trigger a modification of the variable R. For example, $\tau_{max}$ is equal to 112 in one example, while the maximum theoretical level that the parameter t can reach is higher than $\tau_{max}$, and is for example 127. If the parameter $\tau$ is greater than or equal to its maximum level $\tau_{max}$ (branch Y), in an operation 706, the parameter $\tau$ is incremented, and the variable R is set to zero. If, however, the parameter $\tau$ is less than $\tau_{max}$, then in an operation 708, the parameter $\tau$ is increased without setting the variable R to zero. In this way, once the parameter $\tau$ has reached its minimum value $\tau_{min}$ once, it will oscillate between this value and the level $\tau_{min}+1$, without the supply voltage varying.

The algorithms of FIGS. 4 and 7 are based on incrementing or decrementing the parameter $\tau$ by a step size of one. In alternative embodiments, faster convergence can be achieved using a variable step size, as will now be described in more detail with reference to FIGS. 8, 9 and 10.

Figure 8:
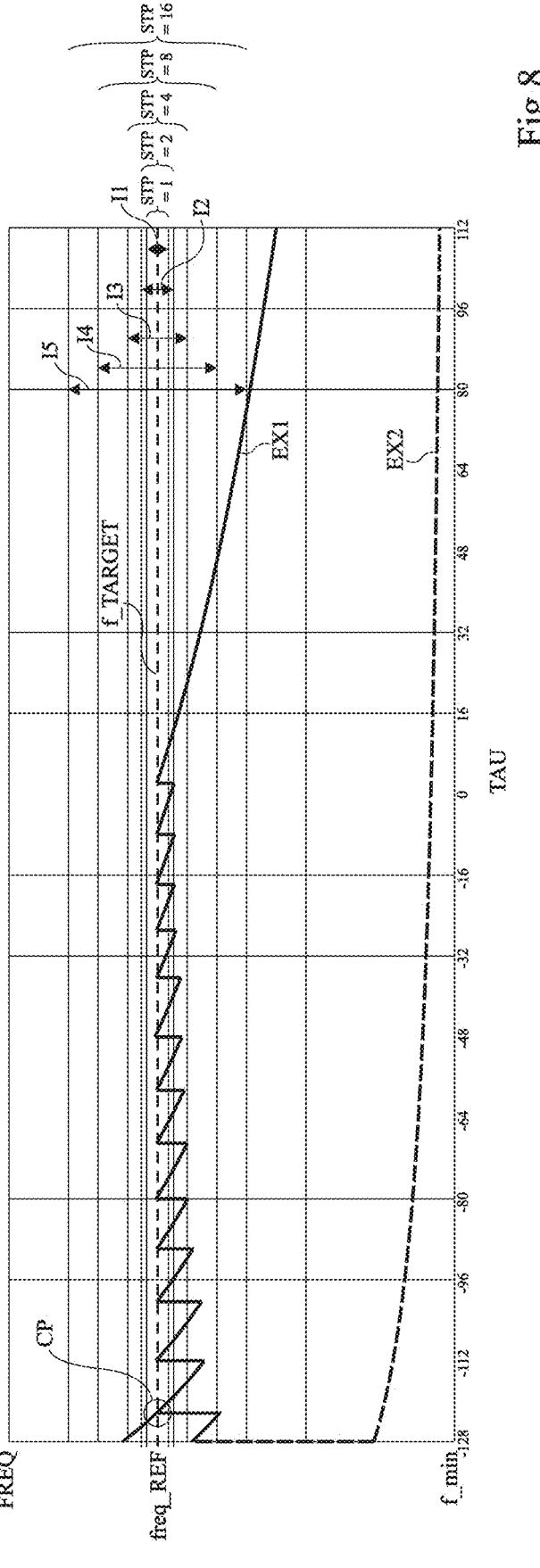
FIG. 8 is a graph representing frequency as a function of the loop delay parameter $\tau$ for a range of voltage settings.

FIG. 8 is a graph representing frequency (FREQ) as a function of the parameter $\tau$ (TAU) for a range of voltage settings. Two examples EX1 and EX2 are illustrated showing convergence of the parameter $\tau$ towards the convergence point CP, the example EX1 being based on an initial supply voltage equal to Vdd_max, and the example EX2 being based on an initial supply voltage equal to Vdd_min. In both examples, the parameter $\tau$ is decremented until it reaches minimum level $\tau_{min}$, and the step size for example depends on whether the frequency of the signal F_RO has exceeded the target frequency freq_TARGET, on whether the hysteresis cycle has been entered, and/or on how close the frequency of the signal F_RO is to r times the frequency of the reference frequency signal f_REF.

For example, until the frequency of the signal F_RO has exceeded r times the frequency of the reference frequency signal f_REF, the supply voltage is constant, and the step size is for example equal to a relatively big step size, equal for example to 16 in one example.

Once the frequency of the signal F_RO has exceeded r times the frequency freq_REF, and if the hysteresis cycle has not been entered (case occurring in EX1 but not in EX2), the step size for example depends on how close the frequency of the signal F_RO is to r times the frequency freq_REF. For example, as represented on the right-hand side of FIG. 8, if r times the frequency of the target signal F_RO is:

within a frequency interval I1, equal for example to freq_REF plus or minus j Hz, the step size is equal to 1 (STP=1);

within a frequency interval I2, equal for example to freq_REF plus or minus k Hz, where k>j, the step size is equal to 2 (STP=2);

within a frequency interval I3, equal for example to freq_REF plus or minus 1 Hz, where l>k, the step size is equal to 4 (STP=4);

within a frequency interval I4, equal for example to freq_REF plus or minus s Hz, where s>l, the step size is equal to 8 (STP=8); and within a frequency interval I5, equal for example to freq_REF plus or minus q Hz, where q>p, the step size is equal to 16 (STP=16).

Once the hysteresis cycle has been entered, the step size is for example reduced to a relatively low value, equal for example to one.

Figure 9:
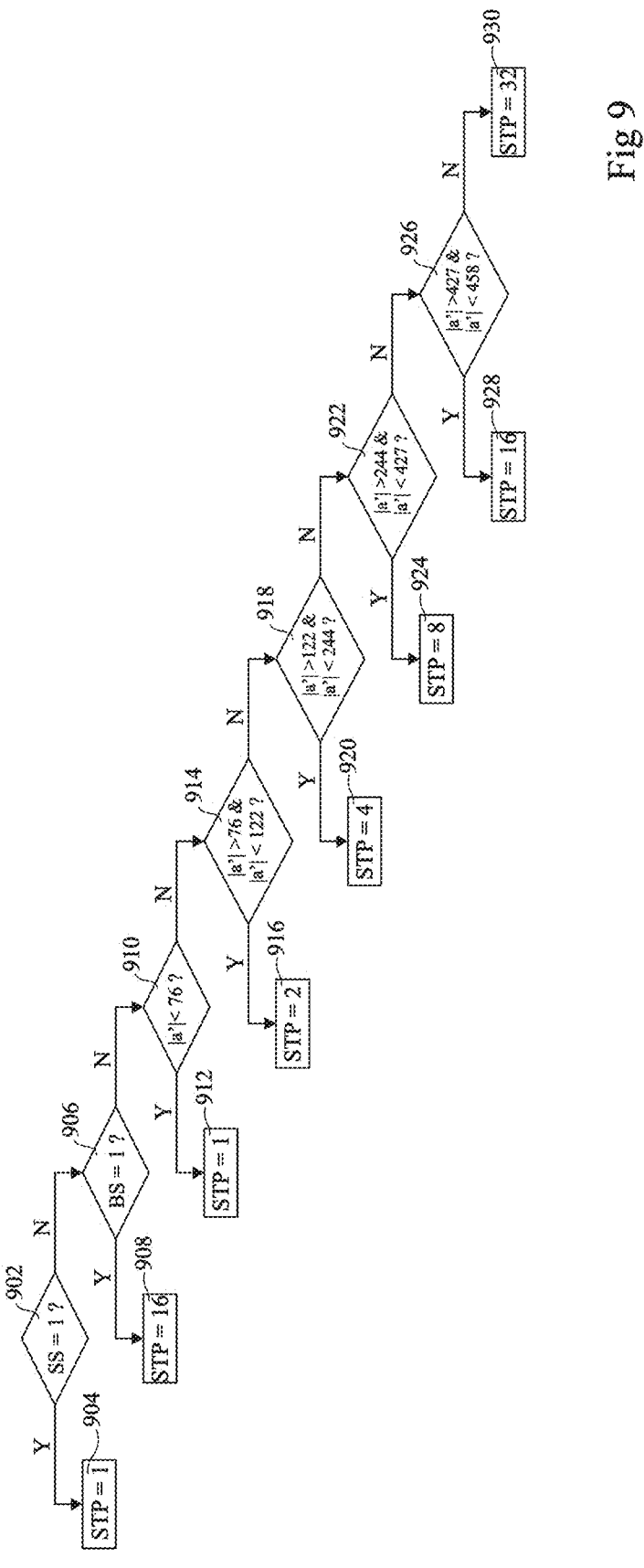
FIG. 9 is a decision tree illustrating the selection of a step size according to an example embodiment of the present disclosure.

FIG. 9 is a decision tree illustrating the selection of the step size according to an example embodiment of the present disclosure. This method is for example implemented by the control circuit 210 of FIG. 2.

In an operation 902, it is for example determined whether a variable SS is set to 1. If so (branch Y), in an operation 904, the step size is for example set to 1 (STP=1). Alternatively, if in operation 902 the variable SS is not set to 1 (branch N), an operation 906 is performed.

In operation 906, it is for example determined whether a variable BS is set to 1. If so (branch Y), in an operation 904, the step size is for example set to 16 (STP=16). Alternatively, if in operation 906 the variable BS is not set to 1 (branch N), an operation 910 is performed.

In operation 910, it is for example determined whether a magnitude of a difference between the frequency of the signal F_RO and the frequency freq_REF less than a first threshold. For example, as mentioned above the frequency detector 204 of FIG. 2 is configured to output the value a' indicating the difference between the frequency of the signal F_RO and r times the frequency freq_REF. In the example of FIG. 9, each period of the reference frequency is expected to correspond to r=610 periods of the ring oscillator clock, and the value a' indicates number of ring oscillator periods during one period of the reference frequency minus 610. Thus, a value of a'=0 for example indicates that the frequency of the signal F_RO is at the target, and a value of a'=610 for example indicates that the frequency of signal F_RO is 2 times higher than expected. For example, in the example of FIG. 9, the first threshold is equal to 76. If |a'|<76 (branch Y), in an operation 912, the step size is for example set to 1 (STP=1). Alternatively, if in operation 910 |a'|≥76 (branch N), an operation 914 is performed.

In operation 914, it is for example determined whether a' is between the first threshold and a second threshold greater than the first threshold. For example, in the example of FIG. 9, the second threshold is equal to 122. If 76<|a'|<122 (branch Y), in an operation 916, the step size is for example set to 2 (STP=2). Alternatively, if in operation 914 |a'|≥122 (branch N), an operation 918 is performed.

In operation 918, it is for example determined whether a' is between the second threshold and a third threshold greater than the second threshold. For example, in the example of FIG. 9, the third threshold is equal to 244. If 122<|a'<244 (branch Y), in an operation 920, the step size is for example set to 4 (STP=4). Alternatively, if in operation 918 |a'|≥244 (branch N), an operation 922 is performed.

In operation 922, it is for example determined whether a' is between the third threshold and a fourth threshold greater than the third threshold. For example, in the example of FIG. 9, the fourth threshold is equal to 427. If 244<|a'|<427 (branch Y), in an operation 924, the step size is for example set to 8 (STP=9). Alternatively, if in operation 922 |a'|≥427 (branch N), an operation 926 is performed.

In operation 926, it is for example determined whether a' is between the fourth threshold and a fifth threshold greater than the fourth threshold. For example, in the example of FIG. 9, the fifth threshold is equal to 458. If 427<|a'|≤458 (branch Y), in an operation 928, the step size is for example set to 16 (STP=16). Alternatively, if in operation 926 |a'|≥458 (branch N), an operation 930 is performed, in which the step size is for example set to 32 (STP=32).

Of course, the above values of the first, second, third, fourth and fifth thresholds are merely examples, and other values would be possible. Furthermore, there could be a different number of thresholds, such as only one, two, three or four thresholds, or more than five thresholds.

Figures 10, 11:
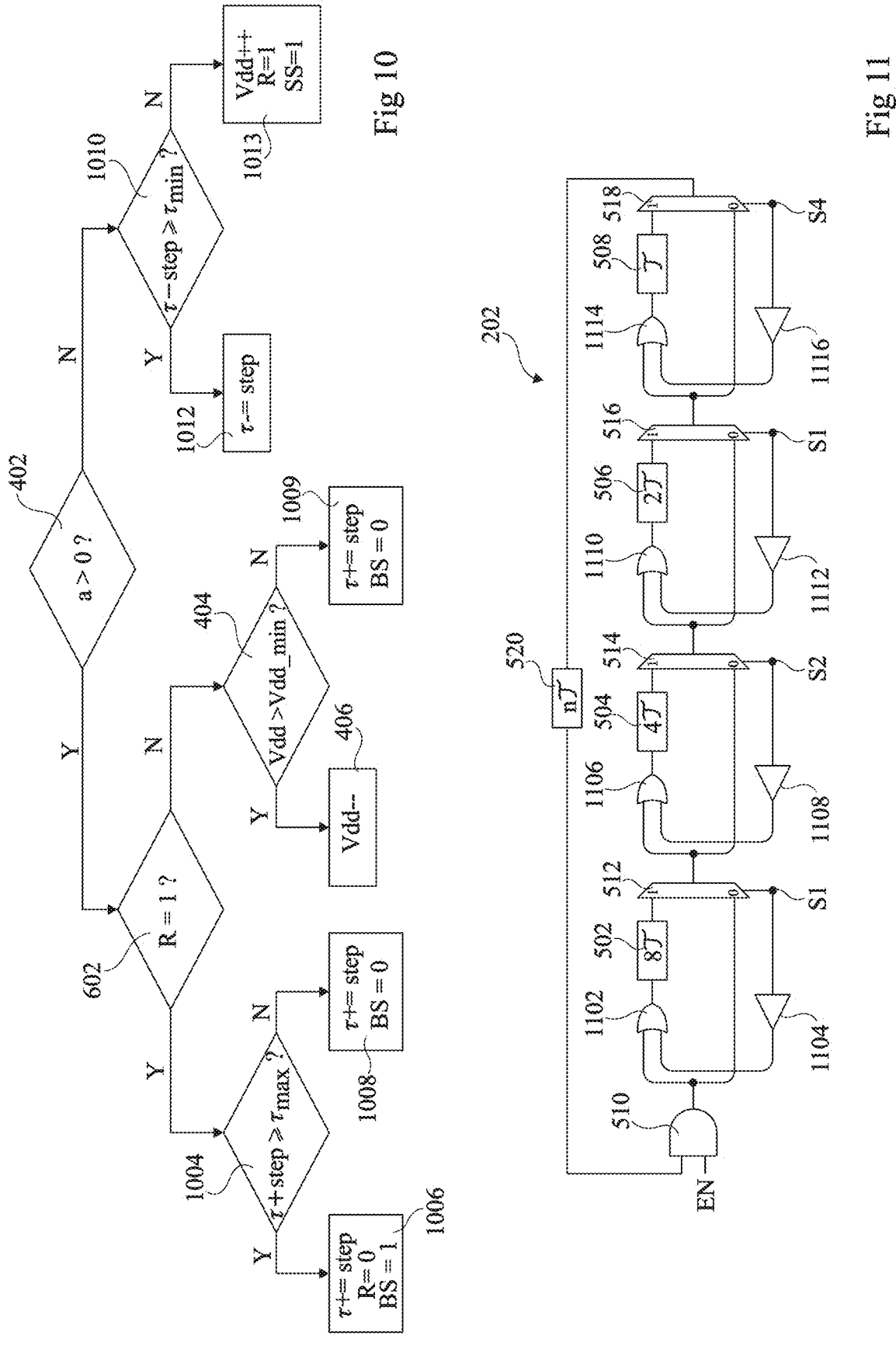
FIG. 10 is a flow diagram illustrating operations in a method of clock generation according to yet a further example embodiment of the present disclosure.
FIG. 11 schematically illustrates an alternative implementation of a ring oscillator according to an example embodiment of the present disclosure.

FIG. 10 is a flow diagram illustrating operations in a method of clock generation according to yet a further example embodiment of the present disclosure. This method is for example implemented by the control circuit 210 of FIG. 2.

Certain operations of FIG. 10 are the same as operations of FIG. 7, and these operations have been labelled with like reference numerals and will not be described again in detail.

With respect to the algorithm of FIG. 7, in the algorithm of FIG. 10, certain operations have been replaced as follows.

The operation 704 of FIG. 7 is replaced in FIG. 10 by an operation 1004 in which it is determined whether T+step≥$\tau_{max}$. If so (branch Y), in an operation 1006 replacing operation 706 of FIG. 7, the parameter τ is increased by the current step size, determined for example by the method of FIG. 9, the variable R is set to zero, and the variable BS is for example set to 1. If in operation 1004 it is determined that τ+step<$\tau_{max}$, then in an operation 1008 replacing operation 708 of FIG. 7, the parameter τ is increased by the current step size, determined for example by the method of FIG. 9, and the variable BS is for example set to 0.

The operation 408 of FIG. 7 is replaced in FIG. 10 by an operation 1009 in which the parameter τ is increased by the current step size, determined for example by the method of FIG. 9, and the variable BS is set equal to zero.

The operation 410 of FIG. 7 is replaced in FIG. 10 by an operation 1010 in which it is determined whether τ−step>$\tau_{min}$. If so (branch Y), in an operation 1012 replacing operation 412 of FIG. 7, the parameter τ is decreased by the current step size, determined for example by the method of FIG. 9. If in operation 1010 it is determined that τ−step<$\tau_{min}$, then in an operation 1013 replacing operation 710 of FIG. 7, the supply voltage Vdd is increased, the variable R is set to 1, and the variable SS is for example set to 1.

FIG. 11 schematically illustrates an alternative implementation of a ring oscillator 202 of FIG. 2 according to an alternative example embodiment to that of FIG. 5. In FIG. 11, certain elements are the same as those of FIG. 5, and these elements have been labelled with like reference numerals and will not be described again in detail.

With respect to the example implementation of FIG. 5, the implementation of FIG. 11 additionally comprises, for example, a logic gate 1102, which is for example an OR gate, coupling the output of the AND gate 510 to the input of the delay element 502. In particular, the OR gate 1102 for example has one of its inputs coupled to the output of the AND gate 510, its other input coupled to receive the control signal S1 via an inverter 1104, and its output coupled to the input of the delay element 502.

Similarly, with respect to the example implementation of FIG. 5, the implementation of FIG. 11 additionally comprises, for example, a logic gate 1106, which is for example an OR gate, coupling the output of the multiplexer 512 to the input of the delay element 504. In particular, the OR gate 1106 for example has one of its inputs coupled to the output of the multiplexer 512, its other input coupled to receive the control signal S2 via an inverter 1108, and its output coupled to the input of the delay element 504.

Similarly again, with respect to the example implementation of FIG. 5, the implementation of FIG. 11 additionally comprises, for example, a logic gate 1110, which is for example an OR gate, coupling the output of the multiplexer 514 to the input of the delay element 506. In particular, the OR gate 1110 for example has one of its inputs coupled to the output of the multiplexer 514, its other input coupled to receive the control signal S3 via an inverter 1112, and its output coupled to the input of the delay element 506.

Similarly again, with respect to the example implementation of FIG. 5, the implementation of FIG. 11 additionally comprises, for example, a logic gate 1114, which is for example an OR gate, coupling the output of the multiplexer 516 to the input of the delay element 508. In particular, the OR gate 1114 for example has one of its inputs coupled to the output of the multiplexer 516, its other input coupled to receive the control signal S4 via an inverter 1116, and its output coupled to the input of the delay element 508.

The addition of the logic gates 1102, 1106, 1110 and 1114 for example helps reduce the risk of glitches occurring upon transitions of the control signals S1 to S4. In particular, when any of the control signals is at zero, the corresponding logic gate 1102, 1106, 1110, 1114 is configured to output a constant logic high state, rather than oscillating based on the signal propagated around the ring. This implies that, when any of the control signals transitions from zero to a logic high state, a stable signal is present at the "1" input of the corresponding multiplexer 512 to 518.

An advantage of the embodiments described herein is that a clock generator having a ring oscillator is able to converge rapidly towards a target frequency while selecting a relatively low supply voltage, thereby reducing power consumption of the ring oscillator. Furthermore, the embodiment of FIG. 7 permits a stable supply voltage once the clock generator has reached the target frequency, and the embodiment of FIG. 10 permits a faster convergence by using variable step sizes of the loop delay parameter τ.

An advantage of using the supply voltage Vdd to supply further circuits, such as the circuit 112, in addition to the clock generator 106 is that this voltage will be regulated to a relatively low level, and thus a relatively low power consumption, while still achieving the targeted performance of the clock generator 106, meaning that this voltage can equally enable the further circuits to achieve their desired performance with relatively low power consumption.

Various embodiments and variants have been described. Those skilled in the art will understand that certain features of these embodiments can be combined and other variants will readily occur to those skilled in the art. For example, it will be apparent to those skilled in the art that the described implementations of the ring oscillators are merely examples, and that other architectures would be possible. Furthermore, it would be possible to combine in different manners the features of the algorithms of FIGS. 4, 7 and 10. As an example, the variable step size of the algorithm of FIG. 10 could be implemented in the algorithm of FIG. 4, in other words without using the variable R.

Furthermore, while an embodiment involving a Sigma-delta controller has been described, in alternative embodiments it would be possible not to use such a controller. An advantage of the use of a Sigma-delta controller is that it permits a finer control of the loop delay of the ring oscillator without the addition of further multiplexers in the ring oscillator, which would degrade its performance.

Finally, the practical implementation of the embodiments and variants described herein is within the capabilities of those skilled in the art based on the functional description provided hereinabove.

The invention claimed is:

1. A clock generator comprising:
   a ring oscillator configured to generate an output frequency signal;
   a frequency detector configured to compare a frequency of the output frequency signal with r times a frequency of a reference frequency signal and to generate a feedback signal based on the comparison; and
   a control circuit configured to control a loop delay parameter of the ring oscillator and a supply voltage of the ring oscillator based on the feedback signal, wherein the control circuit is configured:
      to reduce the frequency of the output frequency signal when its frequency is higher than r times the frequency of the reference frequency signal by reducing the supply voltage without modifying the loop delay parameter, unless the supply voltage has reached a minimal level, in which case the loop delay parameter is then increased; and
      to increase the frequency of the output frequency signal when its frequency is lower than r times the frequency of the reference frequency signal by reducing the loop delay parameter without modifying the supply voltage, unless the loop delay parameter has reached a minimal level, in which case the supply voltage is then increased.

2. The clock generator of claim 1, wherein the control circuit is configured to prevent modifications of the supply voltage once the control circuit has detected that the loop delay parameter has reached its minimal level.

3. The clock generator of claim 1, wherein the control circuit is configured to iteratively reduce and/or increase the loop delay parameter, the reduction or increase upon each iteration being equal to a step size.

4. The clock generator of claim 3, wherein the step size is variable as a function of a frequency difference between the frequency of the output frequency signal and the frequency of the reference frequency signal.

5. The clock generator of claim 3, wherein the step size is equal to a first size until the loop delay parameter reaches the minimal level, and to a second size, lower than the first size, after the loop delay parameter has reached the minimal level.

6. The clock generator of claim 1, further comprising a sigma-delta converter configured to convert the loop delay parameter into a plurality of control signals configured to control the ring oscillator.

7. The clock generator of claim 1, wherein the frequency detector is configured to compare the frequency of the output frequency signal with r times the frequency of the reference frequency signal by comparing the output frequency signal with r times the frequency of the reference frequency signal.

8. The clock generator of claim 1, wherein the ring oscillator comprises a plurality of delay stages coupled in series, each delay stage being configured to be activated or deactivated by the loop delay parameter.

9. The clock generator of claim 8, wherein each delay stage comprising:
   a multiplexer;

a delay element coupled to a first input of the multiplexer, the first input being selected by a first state of a control signal of the multiplexer;

a bypass path coupled to a second input of the multiplexer, the second input being selected by a second state of the control signal of the multiplexer; and a logic gate coupling the output of a previous stage to an input of the delay element, the logic gate receiving the control signal of the multiplexer and being configured to supply a constant signal to the delay element while the control signal is in the second state.

10. The clock generator of claim 1, wherein r is a real number greater than 1.

11. An integrated circuit comprising:

an electronic circuit controlled by a clock signal; and the clock generator of claim 1 configured to supply the clock signal to the electronic circuit.

12. The integrated circuit of claim 11, further comprising:

a voltage regulator configured to generate said supply voltage; and a further electronic circuit powered by said supply voltage.

13. A method of clock generation comprising:

generating, by a ring oscillator, an output frequency signal;

comparing, by a frequency detector, a frequency of the output frequency signal with r times a frequency of a reference frequency signal in order to generate a feedback signal based on the comparison; and controlling, by a control circuit based on the feedback signal, a loop delay parameter of the ring oscillator and a supply voltage of the ring oscillator, by:

reducing the frequency of the output frequency signal when its frequency is higher than r times the frequency of the reference frequency signal by reducing the supply voltage without modifying the loop delay parameter, unless the supply voltage has reached a minimal level, in which case the loop delay parameter is then increased; and increasing the frequency of the output frequency signal when its frequency is lower than r times the frequency of the reference frequency signal by reducing the loop delay parameter without modifying the supply voltage, unless the loop delay parameter has reached a minimal level, in which case the supply voltage is then increased.

14. The method of claim 13, wherein the ring oscillator comprises a plurality of delay stages coupled in series, and wherein reducing the loop delay parameter causes the deactivation of one or more of said delay stages.

* * * * *